United States Patent [19]

Hill

[11] Patent Number: 4,766,469

[45] Date of Patent: Aug. 23, 1988

[54] INTEGRATED BURIED ZENER DIODE AND TEMPERATURE COMPENSATION TRANSISTOR

[75] Inventor: Lorimer K. Hill, Cupertino, Calif.

[73] Assignee: Siliconix Incorporated, Santa Clara, Calif.

[21] Appl. No.: 816,593

[22] Filed: Jan. 6, 1986

[51] Int. Cl.[4] .................. H01L 29/90; H01L 29/72; H01L 29/74; H01L 27/02
[52] U.S. Cl. .......................... 357/13; 357/34; 357/38; 357/43; 357/46
[58] Field of Search ............... 357/13, 34, 38, 88, 357/20, 43, 46; 307/318

[56] References Cited

U.S. PATENT DOCUMENTS

| | | | |
|---|---|---|---|
| 3,300,655 | 1/1967 | Rosenbluth | 307/318 |
| 3,335,358 | 8/1967 | Schultz | 307/318 |
| 4,051,504 | 9/1977 | Hile | 357/13 |
| 4,079,402 | 3/1978 | Dunkley et al. | 357/13 |
| 4,099,998 | 7/1978 | Ferro et al. | 148/187 |
| 4,127,859 | 11/1978 | Nelson | 357/13 |
| 4,136,349 | 1/1979 | Tsang | 357/13 |
| 4,153,904 | 5/1979 | Tasch, Jr. et al. | 357/13 |
| 4,319,257 | 3/1982 | Beasom | 357/13 |
| 4,398,142 | 8/1983 | Beasom | 323/226 |
| 4,496,963 | 1/1985 | Dunkley et al. | 357/22 |
| 4,672,403 | 6/1987 | Jennings | 357/13 |

FOREIGN PATENT DOCUMENTS 56-32995  9/1982  Japan.
2144267  2/1985  United Kingdom ............ 357/37

OTHER PUBLICATIONS

Dobkin, "Monolithic Temperature Stabilized Voltage Reference With 0.5 ppm/° Drift", 1976 IEEE International Solid–State Circuits Confer., pp. 108–109.

Primary Examiner—Martin H. Edlow
Assistant Examiner—David R. Josephs
Attorney, Agent, or Firm—Kenneth E. Leeds; Edel M. Young; Alan H. MacPherson

[57] ABSTRACT

A Zener diode (D) exhibiting subsurface breakdown includes a cathode (36) formed entirely within the emitter (22, 28) of a vertical PNP transistor (Q). The base (16) and collector (11) of the PNP transistor are resistively coupled to ground. The emitter of the PNP transistor functions as the anode of the Zener diode. Because of this, it is unecessary to provide an emitter contact. The PNP transistor compensates for changes in Zener breakdown voltage caused by changes in temperature. Because the PNP transistor is formed directly underneath the Zener diode, the temperature of the PNP transistor accurately tracks that of the Zener diode and therefore provides better temperature compensation. Also, because the cathode of the Zener diode is formed directly in the emitter of the PNP transistor, there is no lateral current flow and attendant voltage drop in the emitter of the PNP transistor.

14 Claims, 2 Drawing Sheets

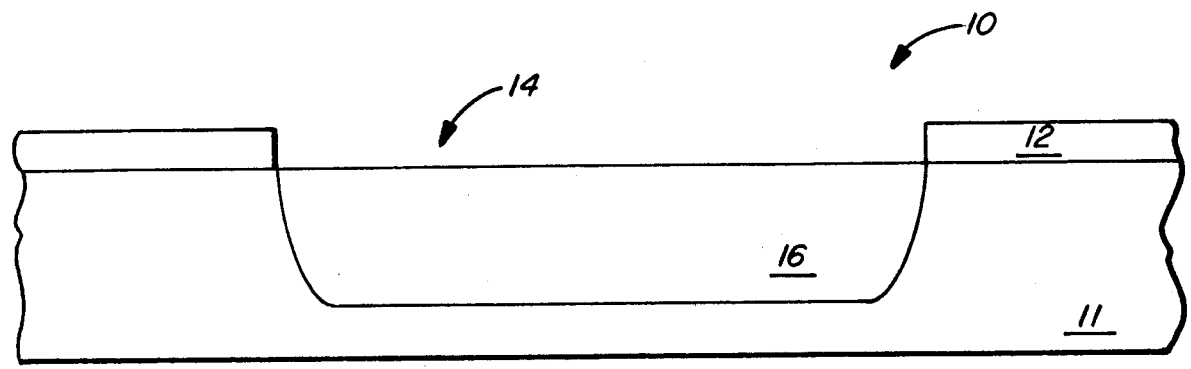
FIG._1.
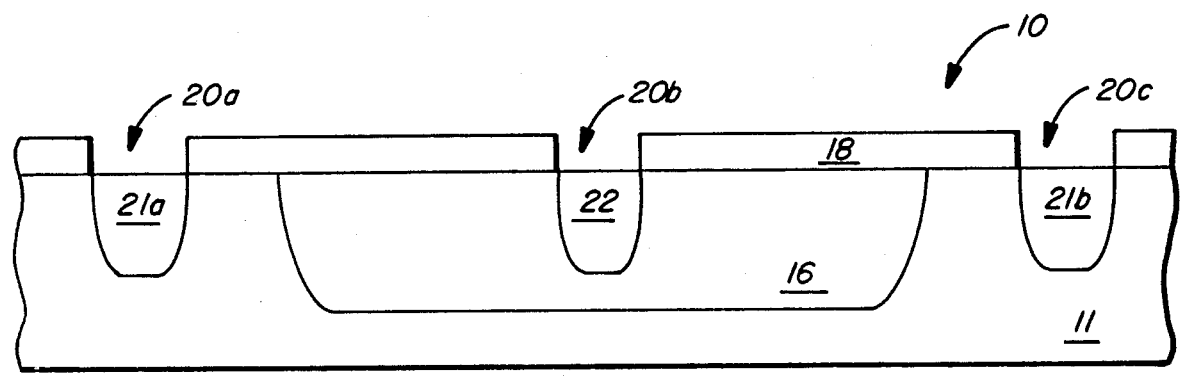
FIG._2.
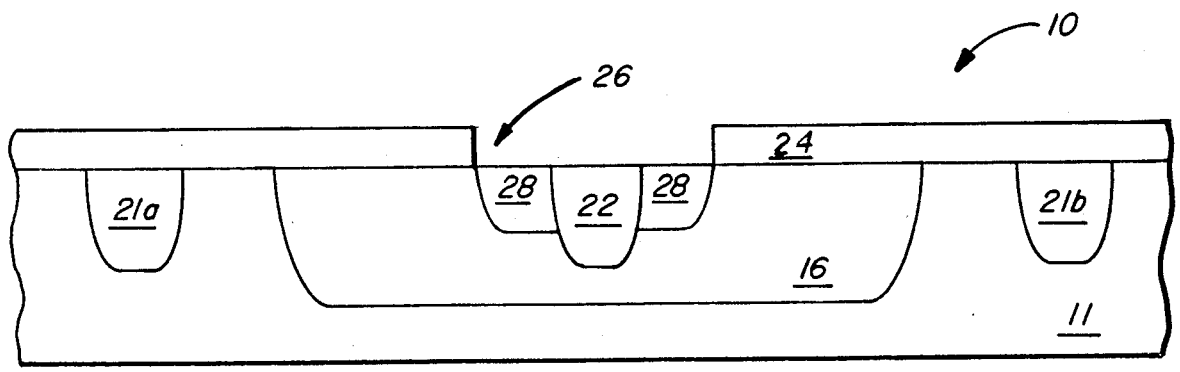
FIG._3.
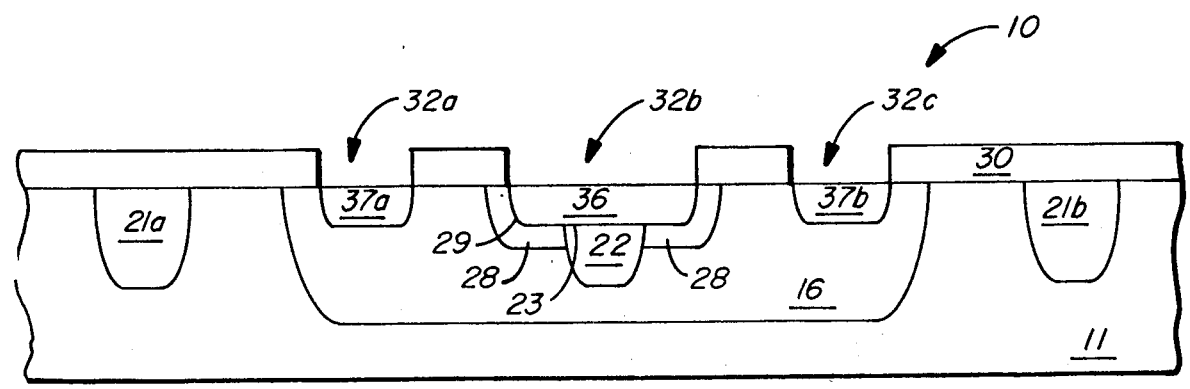
FIG._4.

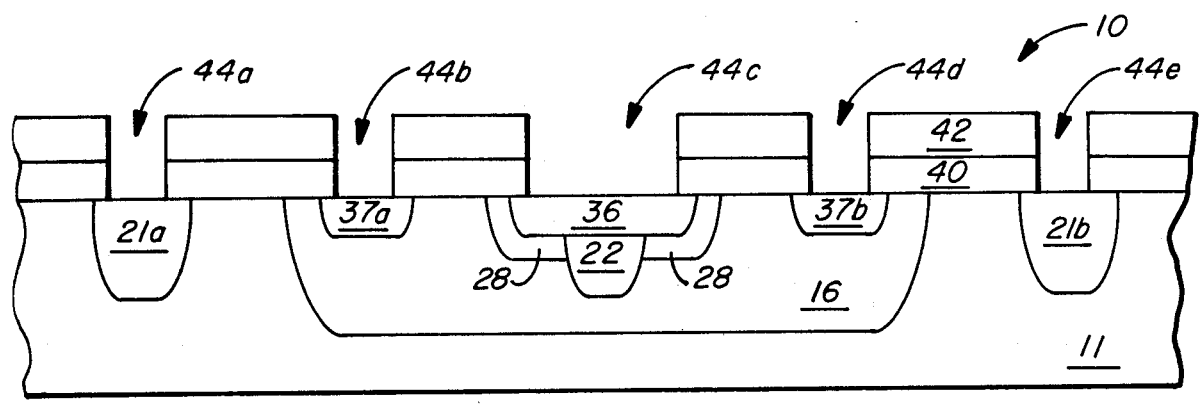
FIG._5.
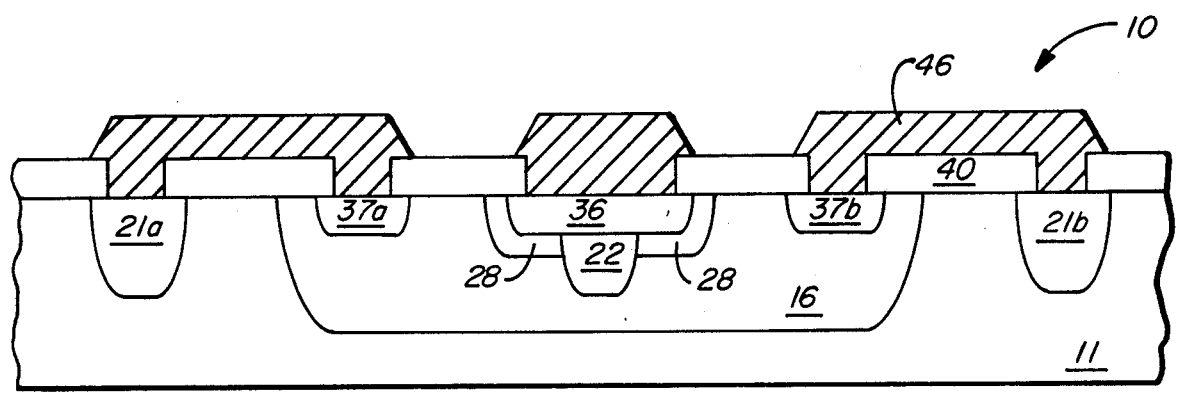
FIG._6.
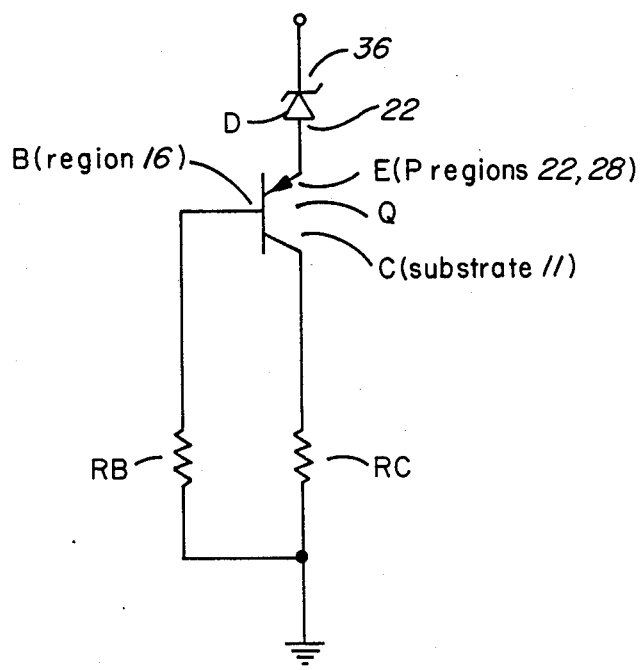
FIG._7.

INTEGRATED BURIED ZENER DIODE AND TEMPERATURE COMPENSATION TRANSISTOR

BACKGROUND

This invention relates to Zener diodes and more specifically, to Zener diodes having a subsurface breakdown region connected to a temperature compensating device.

Zener diodes having subsurface breakdown regions are known in the art. Examples of such Zener diodes are discussed in U.S. Pat. Nos. 4,136,349 issued to Tsang, 4,079,402 issued to Dunkley, et al., 4,398,142 issued to Beasom and 4,319,257 also issued to Beasom, each of these patents being incorporated herein by reference. One reason for confining Zener breakdown to a subsurface region is to avoid drift in the Zener breakdown voltage with time. As is known in the art, a Zener diode exhibiting surface breakdown is subject to breakdown voltage drift because of the presence of a passivating or insulating silicon dioxide layer which typically lies adjacent the silicon surface where the breakdown takes place. This effect is discussed in greater detail in the above-mentioned patents. Accordingly, by causing Zener breakdown to occur at a subsurface region, breakdown voltage drift can be avoided.

It is also known in the art that the Zener breakdown voltage varies with temperature. Accordingly, it is known to couple a Zener diode to a temperature compensating device so that the voltage at the diode cathode relative to ground is relatively constant with respect to temperature. U.S. Pat. No. 4,398,142 discusses a circuit including an NPN transistor connected to a Zener diode to maintain a constant voltage at the Zener cathode. U.S. Pat. No. 4,319,257 illustrates another arrangement for coupling a Zener diode to an NPN transistor in order to compensate for Zener breakdown variation in response to temperature changes.

SUMMARY

The cathode of a Zener diode exhibiting subsurface breakdown is formed within the emitter of a vertical PNP bipolar transistor. The Zener diode exhibits subsurface breakdown and therefore avoids surface effects which cause Zener breakdown voltage drift over time. The vertical PNP transistor compensates for changes in Zener breakdown voltage caused by changes in temperature. Because the PNP transistor is formed directly underneath the Zener diode, the PNP transistor is at the same temperature as the Zener diode and therefore provides more accurate temperature compensation than if the PNP transistor were positioned further from the Zener diode. In addition, because the Zener cathode is formed directly in the emitter of the PNP transistor, there is no need to provide an emitter contact or an anode contact and therefore the transistor can be constructed with a smaller surface area than would be required if emitter and anode contacts were needed.

Because the cathode is formed directly in the emitter, there is no lateral current flowing through the PNP emitter and therefore no resistive voltage drop caused by lateral current flow in the emitter of the PNP transistor. These and other advantages of the present invention will become more apparent with reference to the drawings below.

BRIEF DESCRIPTION OF THE DRAWINGS

FIGS. 1 through 6 illustrate in cross-section a Zener diode and temperature compensating transistor constructed in accordance with the present invention.

FIG. 7 is a schematic diagram of the structure of FIG. 6.

DETAILED DESCRIPTION

A process for forming a Zener diode and temperature compensating PNP transistor in accordance with the present invention begins with the step of covering a semiconductor wafer 10 with a photoresist layer 12 (FIG. 1). (Hereinafter, reference number 11 refers to the semiconductor substrate, while reference number 10 refers to the wafer, i.e. substrate 11 and all layers formed directly or indirectly on the substrate.) In one embodiment, semiconductor wafer 10 is P type silicon having a [100] crystal orientation, and a conductivity of approximately 30 to 50 ohm-centimeters, but other semiconductor materials, crystal orientations, and conductivities can also be used. Referring to FIG. 1, a window 14 is formed in photoresist layer 12 via conventional techniques to define the base of a subsequently formed PNP transistor. An N type base 16 is then formed in the area defined by window 14. In one embodiment, this is done by subjecting wafer 10 to an ion implantation process using N type ions such as phosphorus ions.

Referring to FIG. 2, photoresist layer 12 is then removed and wafer 10 is covered with a photoresist layer 18. Photoresist layer 18 is then patterned, e.g. by selective exposure to light and removal of the exposed portions, thereby forming windows 20a, 20b and 20c. Windows 20a and 20c coincide with the area where electrical contacts to substrate 11 are to be formed, while window 20b defines a portion of a combination Zener diode anode and PNP transistor emitter. Wafer 10 is then subjected to an ion implantation process using P type ions such as boron ions, thereby forming P+ region 22. As is described below, P+ region 22 forms part of a combination emitter and anode for the subsequently formed PNP transistor and Zener diode, respectively. During ion implantation, P+ regions 21a and 21b are also formed. This is done to facilitate the formation of subsequently formed electrical contacts to substrate 11 as described below.

Referring to FIG. 3, photoresist layer 18 is removed and wafer 10 is covered with a photoresist layer 24. Photoresist layer 24 is patterned, e.g. by selective exposure to light and removal of the exposed portions, thereby forming window region 26. Window region 26 defines a subsequently formed P region 28 which is used to confine Zener breakdown to a subsurface portion of the Zener diode, as explained in greater detail below. Wafer 10 is then subjected to an ion implantation process during which P type ions, such as boron ions, are implanted into the portion of wafer 10 exposed by window 26, thereby forming P region 28. (Although illustrated as two regions, P region 28 is a single contiguous region laterally surrounding P region 22). Of importance, the concentration of dopants in P region 28 is less than the concentration of dopants in P region 22. As will hereinafter become apparent, this facilitates the confinement of Zener breakdown to a subsurface region in a subsequently formed Zener diode.

At this point in the process, wafer 10 includes P regions 22 and 28 (emitter of the PNP transistor), and N region 16 (the base of the PNP transistor) formed in P substrate 11 (the collector of the PNP transistor).

Referring to FIG. 4, photoresist layer 24 is then removed and wafer 10 is covered with a photoresist layer 30. Photoresist layer 30 is then patterned by selective exposure to light and removal of the exposed portions, thereby resulting in the formation of windows 32a, 32b and 32c. Windows 32a and 32c coincide with subsequently formed electrical contacts to base region 16. An N type cathode 36 is formed in the area defined by window 32b. In one embodiment, this is done by subjecting wafer 10 to an N type ion implantation process using, for example, arsenic ions.

Of importance, because P region 22 has a higher dopant concentration than P region 28, the Zener breakdown voltage across PN junction 23 between regions 36 and 22 is lower than the Zener breakdown voltage across PN junction 29 between regions 36 and 28. When breakdown does occur, it occurs across the junction having the lower breakdown voltage, i.e. junction 23, which is formed entirely beneath the surface of wafer 10. In this way, a Zener diode has been formed exhibiting subsurface breakdown.

During formation of cathode 36, N+ regions 37a and 37b (defined by windows 32a and 32c, respectively) are also formed. This facilitates electrical contact to base region 16 of the PNP transistor.

Referring to FIG. 5, photoresist layer 30 is then removed, and a layer of silicon dioxide 40 is then formed on wafer 10. In other embodiments, silicon dioxide layer 40 is grown during various drive-in diffusion steps associated with the various regions formed within wafer 10. A photoresist layer 42 is then formed on wafer 10 and patterned in a conventional manner leaving window regions 44a through 44e. As will subsequently become apparent, window regions 44a and 44e define an electrical contact to P type substrate 11 (the collector of the PNP transistor), window regions 44b and 44d define an electrical contact to N type base region 16, and window region 44c defines an electrical contact to cathode 36. The portions of silicon dioxide layer 40 underlying window regions 44a through 44e are then removed using conventional etching techniques, e.g. placing wafer 10 in a buffered HF solution.

Thereafter, photoresist layer 42 is removed and wafer 10 is covered with a layer of conductive material 46 (FIG. 6). In one embodiment, conductive material 46 is metal, such as aluminum or an alloy of aluminum, but other conductive materials such as polycrystalline silicon can also be used.

Conductive material 46 is patterned using conventional techniques, e.g. covering wafer 10 with photoresist (not shown), patterning the photoresist thereby exposing portions of the conductive material, removing the exposed portions of conductive material, and removing the remaining photoresist.

A schematic diagram of the resulting structure is provided in FIG. 7. As can be seen in FIG. 7, the junction between N+ cathode 36 and P+ anode 22 forms the PN junction of a Zener diode D. P+ region 22 and P region 28 form the emitter E of a PNP transistor Q. N region 16 forms the base B of transistor Q and substrate 11 forms the collector C of transistor Q. Base B and collector C are coupled to ground via resistors RB and RC, respectively, which model the lateral resistance of N region 16 and substrate 11, respectively.

Although FIGS. 1 through 6 illustrate a Zener diode and transistor in which P type substrate 11 serves as the collector, in other embodiments, a P well within an N type substrate or epitaxial layer serves as the PNP collector.

While the invention has been described in detail with respect to specific embodiments, those skilled in the art will recognize that changes can be made in form and detail without departing from the spirit and scope of the invention. Accordingly, all such modifications come within the scope of the present invention.

I claim:

1. A circuit comprising:
    a transistor including first, second and third semiconductor regions, said first semiconductor region being of a first conductivity type and containing said second semiconductor region, said first semiconductor region serving as the collector of said transistor, said second semiconductor region being of a second conductivity type and contacting said third semiconductor region, said second semiconductor region serving as the base of said transistor, said third semiconductor region being of said first conductivity type and serving as the emitter of said transistor; and
    a Zener diode, the cathode of said Zener diode comprising a fourth semiconductor region of said second conductivity type formed within said third semiconductor region, said third semiconductor region serving as the anode of said Zener diode.

2. The circuit of claim 1 wherein said transistor is a vertical transistor.

3. The circuit of claim 2 wherein said transistor is a PNP transistor.

4. The circuit of claim 1 wherein the collector and base of said transistor are coupled to ground.

5. The circuit of claim 1 wherein said base and collector are resistively coupled to ground.

6. The circuit of claim 1 wherein said collector is the substrate of a semiconductor wafer.

7. The circuit of claim 1 wherein said Zener diode exhibits subsurface breakdown.

8. A semiconductor device having a major surface, said semiconductor device comprising:
    a first semiconductor region of a first conductivity type, said first semiconductor region serving as the collector of a transistor;
    a second semiconductor region contacting said first semiconductor region and having a second conductivity type opposite said first conductivity type, said second semiconductor region serving as the base of said transistor;
    a third semiconductor region of said first conductivity type formed within said second semiconductor region, said third semiconductor region serving as the anode of a Zener diode, the emitter of said transistor comprising said third semiconductor region; and
    a fourth semiconductor region formed above but in contact with said third semiconductor region, said fourth semiconductor region being of said second conductivity type, said fourth semiconductor region serving as the cathode of said Zener diode, the junction between said third and fourth semiconductor regions being below said major surface.

9. The semiconductor device of claim 8 further comprising a fifth semiconductor region of said first conductivity type, said fifth semiconductor region laterally circumscribing said fourth semiconductor region, said fifth semiconductor region serving as part of the emitter of said transistor, the breakdown voltage of the PN junction between said fifth and fourth semiconductor regions being greater than the breakdown voltage of the PN junction between said third and fourth semiconductor regions so that said diode exhibits subsurface breakdown.

10. The semiconductor device of claim 9 wherein said second semiconductor region is formed within said first semiconductor region.

11. The semiconductor device of claim 8 wherein the cathode of said Zener diode is formed within the emitter of said transistor.

12. A semiconductor device having a major surface, said semiconductor device comprising:
- a first semiconductor region of a first conductivity type, said first semiconductor region serving as the collector of a transistor;
- a second semiconductor region contacting said first semiconductor region and having a second conductivity type opposite said first conductivity type, said second semiconductor region serving as the base of said transistor;
- a third semiconductor region of said first conductivity type formed within said second semiconductor region, the emitter of said transistor comprising said third semiconductor region; and
- a fourth semiconductor region formed above but in contact with said third semiconductor region, said fourth semiconductor region being of said second conductivity type, said third and fourth semiconductor regions and the junction between said third and fourth semiconductor regions serving as a Zener diode, the junction between said third and fourth semiconductor regions being below said major surface.

13. The semiconductor device of claim 12 wherein said second semiconductor region is formed in said first semiconductor region.

14. A circuit comprising:
- a transistor including first, second and third semiconductor regions, said first semiconductor region being of a first conductivity type and contacting said second semiconductor region, said first semiconductor region serving as the collector of said transistor, said second semiconductor region being of a second conductivity type and contacting said third semiconductor region, said second semiconductor region serving as the base of said transistor, said third semiconductor region being of said first conductivity type and serving as the emitter of said transistor; and
- a fourth semiconductor region of said second conductivity type formed within said third semiconductor region, said third and fourth semiconductor regions and the junction between said third and fourth semiconductor regions serving as a Zener diode.

* * * * *

UNITED STATES PATENT AND TRADEMARK OFFICE
CERTIFICATE OF CORRECTION

PATENT NO. : 4,766,469

DATED : 08/23/88

INVENTOR(S) : Lorimer K. Hill

It is certified that error appears in the above-identified patent and that said Letters Patent is hereby corrected as shown below:

Column 4, line 14, claim 1: "containing" should read --contacting--.

Signed and Sealed this

Fourth Day of April, 1989

Attest:

DONALD J. QUIGG

Attesting Officer

Commissioner of Patents and Trademarks